United States Patent
Bae

(10) Patent No.: US 7,133,281 B2
(45) Date of Patent: Nov. 7, 2006

(54) DISPLAY DEVICE AND HEAT DISSIPATING CHASSIS THEREFOR

(75) Inventor: Sung-Won Bae, Suwon-si (KR)

(73) Assignee: Samsung SDI. Co., Ltd., Suwon-Si (KR)

( * ) Notice: Subject to any disclaimer, the term of this patent is extended or adjusted under 35 U.S.C. 154(b) by 0 days.

(21) Appl. No.: 10/947,933

(22) Filed: Sep. 22, 2004

(65) Prior Publication Data

US 2005/0062383 A1    Mar. 24, 2005

(30) Foreign Application Priority Data

Sep. 24, 2003    (KR) .................. 10-2003-0066265

(51) Int. Cl.
*G06F 1/16*    (2006.01)
*G06F 1/20*    (2006.01)

(52) U.S. Cl. ............... 361/681; 361/687; 345/58; 313/44

(58) Field of Classification Search ........... 361/681, 361/687; 345/58, 679; 313/44
See application file for complete search history.

(56) References Cited

U.S. PATENT DOCUMENTS

| | | | | |
|---|---|---|---|---|
| 4,980,848 A | * | 12/1990 | Griffin et al. | 361/687 |
| 5,606,341 A | * | 2/1997 | Aguilera | 361/687 |
| 5,666,261 A | * | 9/1997 | Aguilera | 361/681 |
| 5,774,333 A | * | 6/1998 | Janik et al. | 361/687 |
| 5,982,617 A | * | 11/1999 | Haley et al. | 361/687 |
| 6,494,429 B1 | * | 12/2002 | Tajima | 361/681 |
| 6,563,705 B1 | * | 5/2003 | Kuo | 361/687 |
| 2004/0036819 A1 | * | 2/2004 | Ryu et al. | 361/687 |

FOREIGN PATENT DOCUMENTS

| JP | 11-233968 | 8/1999 |
|---|---|---|
| JP | 2001-134195 | 5/2001 |

OTHER PUBLICATIONS

Patent Abstracts of Japan for Publication No. 2001-134195; Date of publication of application May 18, 2001, in the name of Takashi Saito et al.
Patent Abstracts of Japan for Publication No. 11-233968; Date of publication of application Aug. 27, 1999, in the name of Shigeo Hirano et al.

* cited by examiner

*Primary Examiner*—Lisa Lea-Edmonds
(74) *Attorney, Agent, or Firm*—Christie, Parker & Hale, LLP

(57) ABSTRACT

A display device heat dissipating panel. A chassis is provided that has improved heat transferring characteristics as well as sufficient structural integrity, thereby decreasing the temperature in a front portion of the PDP. A plasma display panel that is attached to a chassis base. A driving circuit which drives the plasma display panel is mounted to the chassis base. The chassis base includes a first plate to which the plasma display panel is attached. A second plate is disposed to face the first plate and is adjacent to the first plate, the driving circuit being mounted to the second plate. A reinforcing member is disposed between the first plate and the second plate and connects the first and second plates.

21 Claims, 3 Drawing Sheets

DISPLAY DEVICE AND HEAT DISSIPATING CHASSIS THEREFOR

CROSS-REFERENCE TO RELATED APPLICATION

This application claims priority to and the benefit of Korean Patent Application No. 2003-0066265 filed on Sep. 24, 2003 in the Korean Intellectual Property Office, the entire content of which is incorporated herein by reference.

FIELD OF THE INVENTION

The present invention relates to a display device, and more particularly, to a display device chassis that can effectively dissipate heat generated in plasma display panels or in driving circuits.

BACKGROUND OF THE INVENTION

A plasma display device displays images on a plasma display panel (hereinafter referred to as a PDP) using plasma generated by the discharge of gas.

Generally, the plasma display device includes a PDP, a chassis base to which the PDP is attached, and driving circuits that are mounted to the chassis base and drive the PDP.

Generally, the PDP may be attached to a front surface of the chassis through an attaching agent such as double-sided adhesive tape, and the driving circuits are mounted to a rear surface of the chassis base.

In such a plasma display device, the chassis base supports the PDP. Therefore, the chassis base is formed to have high structural resistance to bending or twisting.

While operating the plasma display device, significant heat is generated in the PDP and the driving circuits. Because the PDP and the driving circuits can be damaged by such heat, it is important to effectively dissipate such heat from the plasma display device.

In particular, because the chassis base contacts both the PDP and the driving circuits, the chassis base needs to be formed to effectively dissipate heat. Therefore, generally the chassis base may be made of material having good heat conductivity such as aluminum, and the chassis base is sometimes provided with a cooling fin.

In some prior art plasma display devices, the chassis base has been formed as a single plate attached to a rear surface of the PDP. In such a structure, there are difficulties in dissipating heat generated in the PDP and a large portion of the heat is discharged through a front portion of the PDP so that the temperature of the front portion of the PDP may rise excessively. This may cause inconvenience during use.

Furthermore, because the driving circuits are mounted to the chassis base, heat generated in the driving circuits cannot be effectively eliminated.

SUMMARY OF THE INVENTION

In accordance with the present invention, a plasma display device is provided in which heat-transferring characteristics may be improved while maintaining sufficient structural strength.

In an exemplary embodiment of the present invention, the plasma display device includes: a chassis base; a plasma display panel that is attached to the chassis base; and driving circuits that are mounted to the chassis base and drive the plasma display panel. The chassis base may include: a first plate to which the plasma display panel is attached; a second plate disposed to face the first plate and adjacent the first plate, a driving circuit mounted to the second plate; and a reinforcing member that is disposed between the first plate and the second plate, such member connecting the first and second plates.

In a further embodiment, a through hole may be formed at a portion of the second plate corresponding to a position in which the driving circuit is mounted. The reinforcing member may be constructed such that it leaves an open space between the first and second plates corresponding to a position of the through hole.

In yet a further embodiment, the driving circuit may be mounted to the second plate so that it is spaced from a surface of the second plate by a predetermined distance.

Additionally, the reinforcing member may be disposed between the first and second plates such that at least one vertical passage is formed between the first and second plates.

The reinforcing member disposed between the first and second plates may have a lateral cross section of, for example, a rectangular shape, a triangular shape or a hexagonal shape. In an exemplary embodiment, each of the first and second plates is made of aluminum or a plastic material. Additionally, the reinforcing member may be made of aluminum, a plastic material or an aluminum-plastic composite material.

DETAILED DESCRIPTION

Figure 1:
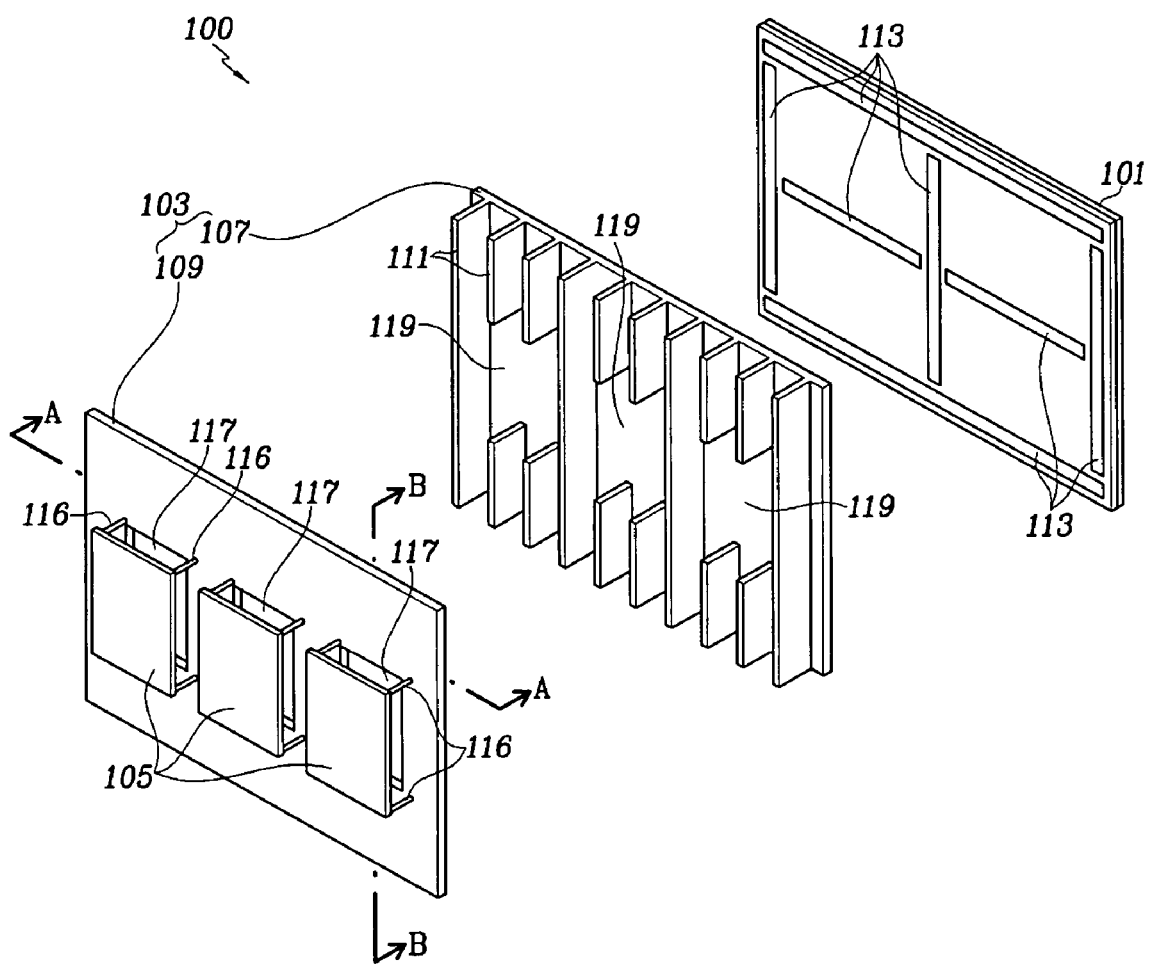
FIG. 1 is an exploded perspective view of a plasma display device according to an embodiment of the present invention.

As shown in FIG. 1, a plasma display device 100 according to an embodiment of the present invention comprises a PDP 101, a chassis base 103, and driving circuits 105.

A front cover (not shown) is coupled to a front side of the PDP 101 and a back cover (not shown) is coupled to a rear side of the chassis base 103 to assemble the plasma display device 100.

The chassis base 103 comprises a front (or first) plate 107 and a rear (or second) plate 109 that are disposed to face each other, and at least one reinforcing member 111 that is disposed between the front and rear plates 107 and 109.

In an exemplary embodiment, a thickness of each of the front and rear plates 107, 109 is approximately 1 mm, and the front and rear plates 107, 109 are spaced from each other by approximately 5~10 mm.

The PDP 101 may be attached to the front plate 107 through an attaching member 113. For example, the attaching member 113 may be double-sided adhesive tape.

The front and rear plates 107, 109 are connected to each other by the reinforcing member 111. Because the reinforcing member 111 provides the chassis base 103 with increased resistance to bending and twisting, the structural strength of the chassis base 103 substantially increases. In addition, the reinforcing member 111 acts as a heat transferring medium through which heat from the front and rear plates 107, 109 is transferred. Additionally, the reinforcing member 111 promotes convective heat transfer.

In an exemplary embodiment, the front and rear plates 107, 109 are made of a material having high structural strength and good thermal conductivity. For example, the front and rear plates 107, 109 may be made of aluminum. Because the chassis base 103 of the plasma display device 101 according to an embodiment of the present invention has good thermal conductivity, it is also possible that the front and rear plates 107, 109 may be made of a plastic material that has a lower thermal conductivity than aluminum. In the case where the front and rear plates 107, 109 are made of a plastic material, they may also be configured to act as an electrical ground.

Similarly, in another exemplary embodiment of the present invention, the reinforcing member Ill may be made from a material having high structural strength and good thermal conductivity. For example, the reinforcing member 111 may be made of aluminum, a plastic material or an aluminum-plastic composite material.

In one embodiment, the reinforcing member 111 may be connected to the front and rear plates 107, 109 such that at least one column (vertical passage) 115 (FIG. 2) is formed between the front and rear plates 107, 109.

Figure 2:
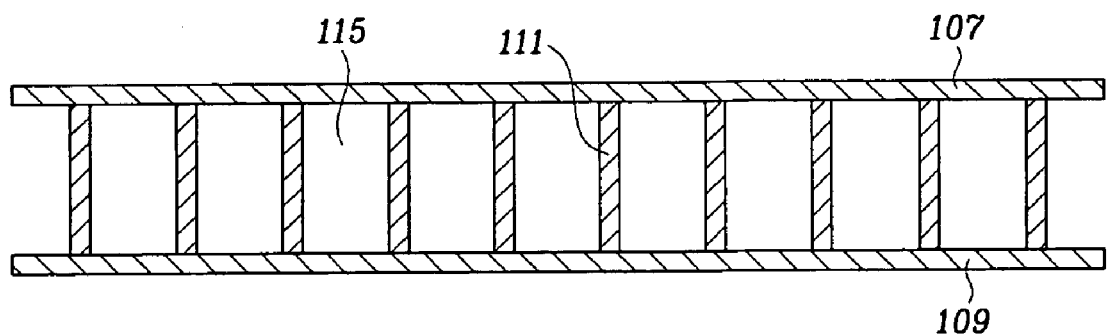
FIG. 2 is a sectional view of a chassis base taken along a line A—A in FIG. 1.

FIG. 2 is a sectional view of the chassis base 103 taken along a line A—A in FIG. 1. As shown in FIG. 2, the reinforcing member 111 is connected to the front and rear plates 107, 109 such that a vertical passage with a lateral cross section of a rectangular shape is formed.

That is, as shown in FIG. 1, a plurality of reinforcing members 111 having a plate shape are continuously disposed at predetermined intervals so that vertical passages 115 are formed between the reinforcing members 111.

Figure 3:
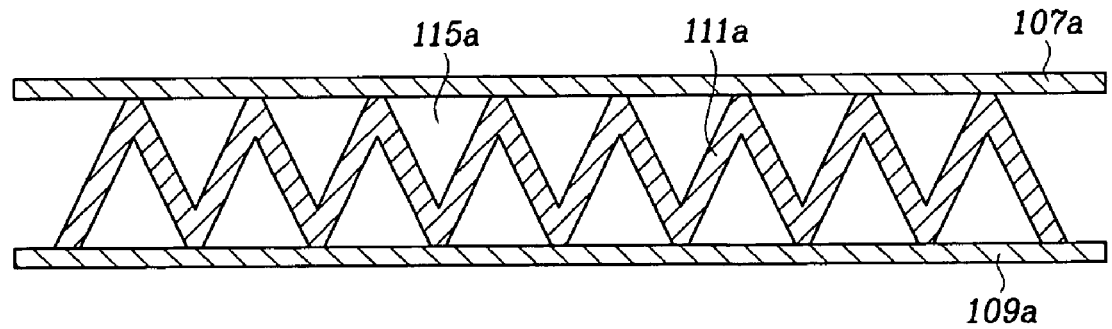
FIGS. 3 and 4 are modified examples of a reinforcing member.
Figure 4:
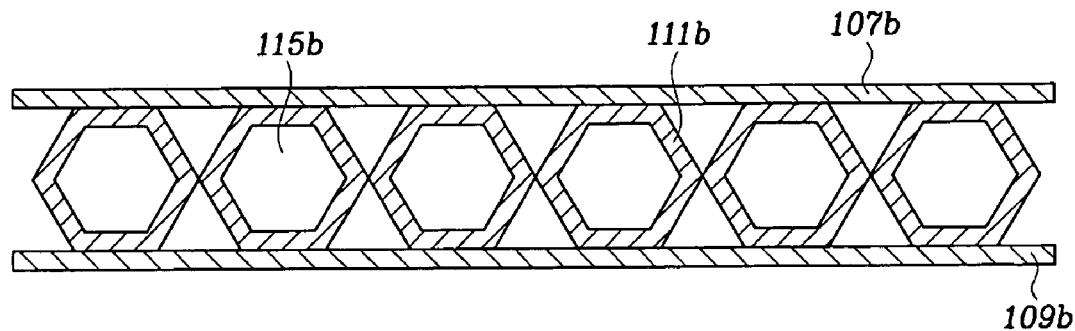

FIGS. 3 and 4 show examples of alternate shapes of the reinforcing members 111a and 111b, respectively.

In FIG. 3, reinforcing members 111a are disposed between a front plate 107a and a rear plate 109a such that a lateral cross section of a vertical passage 115a has a triangular shape. In FIG. 4, reinforcing members 111b are disposed between a front plate 107b and a rear plate 109b such that a lateral cross section of a vertical passage 115b has a hexagonal shape.

Although in the exemplary embodiments the cross-sectional shape of the vertical passages are triangles, rectangles, or hexagons, it is also possible that the cross-sectional shape of the vertical passage can be of any shape including any polygon or a circle.

Figure 5:
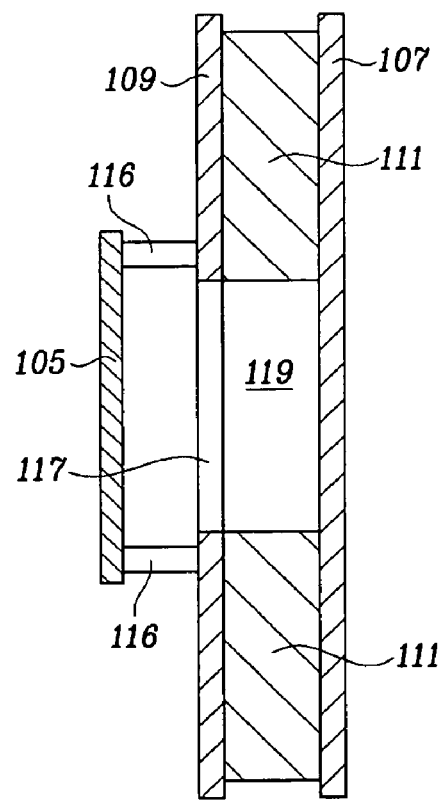
FIG. 5 is a sectional view of a chassis base taken along a line B—B in FIG. 1.

As shown in FIG. 5, the driving circuit 105 is mounted to the rear plate 109. The driving circuit 105 may include any circuit for driving the PDP 101, and it includes circuit elements for driving the PDP 101 and a circuit board (not shown). There may also be an electrical connection between the driving circuit 105, the PDP 101 (not shown) and other electrical devices, power sources and the like.

In one embodiment, the driving circuit 105 may be mounted to the rear plate 109 through a coupling member 116. As shown in FIGS. 1 and 5, the driving circuit 105 may be mounted to the rear plate so that it is spaced from a surface of the rear plate 109 by a predetermined distance.

A through hole 117 is formed at a portion of the rear plate 109 corresponding to a position in which the driving circuit 105 is mounted. In an exemplary embodiment, an area of the through hole 117 is approximately the same size as the area of driving circuit 105. Thus, heat that is generated by the PDP 101 and the driving circuit 105 can be effectively discharged through the through hole 117.

In an additional embodiment, as shown in FIGS. 1 and 5, the reinforcing member 111 may be constructed such that it leaves an open space 119 between the front and rear plates 107, 109 corresponding to a position of the through hole 117. Accordingly, such space 119 allows for more effective heat dissipation.

Table 1 below shows comparative results of thermal characteristics between a plasma display device according to an Embodiment of the present invention and a conventional plasma display device example in which a plasma display panel is attached to a single chassis base, results of which were obtained through thermal analysis software "FLO-THERM".

TABLE 1

|  | Conventional Example | Embodiment |
| --- | --- | --- |
| Temp. of chassis base (□) | 63 | 50 |
| Temp. of front EMI filter (□) | 49 | 42 |
| Heat dissipation in front portion of PDP (W) | 80 | 60 |
| Heat dissipation in rear portion of PDP (W) | 70 | 90 |

As shown in Table 1, with respect to the Conventional Example, when heat of 150 W is generated in the PDP, heat of 80 W is dissipated in a front portion the PDP and heat of 70 W is dissipated in a rear portion of the PDP in the comparative example. However, with respect to the Embodiment of the present invention, when the same amount of heat is generated heat of 60 W is dissipated in a front portion the PDP and heat of 90 W is dissipated in a rear portion of the PDP. In other words, with the Conventional Example, the amount of heat dissipation in the front portion is greater than the amount of heat dissipation in the rear portion. However, in the Embodiment of the present invention, the amount of heat dissipation in the front portion is less than the amount of heat dissipation in the rear portion. Decreasing the amount of heat dissipation in the front portion of the PDP would also allow the temperature of an EMI filter which may be placed adjacent to the front portion of the PDP to remain cooler and provides for improved performance of the PDP in general.

In the plasma display device according to the embodiments of the present invention, a structure of the chassis base is improved so that a temperature in a front portion of the PDP can be decreased while obtaining sufficient structural integrity thereof.

Because the chassis includes the front and rear plates and the reinforcing member that is disposed therebetween, heat transferring characteristics can be improved and sufficient structural integrity can also be achieved, thereby decreasing the temperature in a front portion of the PDP.

By forming the through hole at a portion of the rear plate corresponding to the position to which the driving circuit is mounted, heat transferring characteristics can be further improved.

Further, because the reinforcing member is not disposed at a region between the front and rear plates corresponding to a position of the through hole, heat radiation characteristics of the chassis base can be further improved.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A display device comprising:
   a chassis base,
   a display panel attached to the chassis base, and
   one or more display panel driving circuits mounted to the chassis base,
   wherein the chassis base comprises:
      a first plate to which the display panel is attached;
      a second plate disposed to face the first plate and to be adjacent to the first plate, the one or more display panel driving circuits being mounted to the second plate; and
      one or more reinforcing members disposed between the first plate and the second plate, the one or more reinforcing members connecting the first plate and the second plate,
   wherein the first and second plates are made of thermal conductive material.

2. The display device of claim 1, wherein the reinforcing member is disposed between the first plate and the second plate such that at least one column is formed between the first plate and the second plate.

3. The display device of claim 2, wherein the reinforcing member is disposed between the first and second plates such that a lateral cross section of the passage has a shape selected from the group of a rectangular shape, a triangular shape, or a hexagonal shape.

4. The display device of claim 1, wherein each of the first plate and the second plate is made of a material selected from the group of aluminum or a plastic material.

5. The display device of claim 1, wherein the reinforcing member is made of a material selected from the group of aluminum, a plastic material, or an aluminum-plastic composite material.

6. The display device of claim 1, wherein the display panel is a plasma display panel.

7. A display device comprising:
   a chassis base,
   a display panel attached to the chassis base, and
   one or more display panel driving circuits mounted to the chassis base,
   wherein the chassis base comprises:
      a first plate to which the display panel is attached;
      a second plate disposed to face the first plate and to be adjacent to the first plate, the one or more display panel driving circuits being mounted to the second plate; and
      one or more reinforcing members disposed between the first plate and the second plate, the one or more reinforcing members connecting the first plate and the second plate,
   wherein a through hole is formed at a portion of the second plate corresponding to a position where the one or more display panel driving circuits are mounted.

8. The display device of claim 7, wherein the reinforcing member is constructed such that it leaves an open space between the first and second plates corresponding to a position of the through hole.

9. The display device of claim 7, wherein the one or more display panel driving circuits are mounted to the second plate spaced from a surface of the second plate by a predetermined distance.

10. A heat dissipating chassis apparatus for display devices comprising:
    a first plate attachable to a display panel;
    a second plate attachable to a display panel for mounting one or more display panel driving circuits; and
    one or more reinforcing members disposed between the first plate and the second plate connecting the first plate and the second plate,
    wherein the first and second plates are made of thermal conductive material.

11. The heat dissipating chassis apparatus of claim 10, wherein the reinforcing member is disposed between the first plate and the second plate such that at least one column is formed between the first plate and the second plate.

12. The heat dissipating chassis apparatus of claim 11, wherein the reinforcing member is disposed between the first and second plates such that a lateral cross section of the passage has a shape selected from the group of a rectangular shape, a triangular shape, or a hexagonal shape.

13. The heat dissipating chassis apparatus of claim 10, wherein each of the first plate and the second plate is made of a material selected from the group of aluminum or a plastic material.

14. The heat dissipating chassis apparatus of claim 10, wherein the reinforcing member is made of a material selected from the group of aluminum, a plastic material, or an aluminum-plastic composite material.

15. The heat dissipating chassis apparatus of claim 10, wherein the display panel is a plasma display panel.

16. A heat dissipating chassis apparatus for display devices comprising:
    a first plate attachable to a display panel;
    a second plate attachable to a display panel for mounting one or more display panel driving circuits; and
    one or more reinforcing members disposed between the first plate and the second plate connecting the first plate and the second plate,
    wherein a through hole is formed at a portion of the second plate corresponding to a position where the one or more display panel driving circuits are mounted.

17. The heat dissipating chassis apparatus of claim 16, wherein the reinforcing member is constructed such that it leaves an open space between the first and second plates corresponding to a position of the through hole.

18. The heat dissipating chassis apparatus of claim 16, wherein the one or more driving circuits are mounted to the second plate spaced from a surface of the second plate by a predetermined distance.

19. A display device comprising:
    a chassis base,
    a display panel attached to the chassis base, and
    one or more display panel driving circuits mounted to the chassis base,
    wherein the chassis base comprises:
       a first plate to which the display panel is attached;
       a second plate disposed to face the first plate and to be adjacent to the first plate, the one or more display panel driving circuits being mounted to the second plate; and
       one or more reinforcing members disposed between the first plate and the second plate, the one or more reinforcing members connecting the first plate and the second plate,
    wherein the chassis base is between the display panel and the one or more display panel driving circuits.

20. The display device of claim 19, wherein the display panel is between a front cover and a back cover.

21. A display device comprising:
a chassis base,
a display panel attached to the chassis base, and
one or more display panel driving circuits mounted to the chassis base,
wherein the chassis base comprises:
- a first plate to which the display panel is attached;
- a second plate disposed to face the first plate and to be adjacent to the first plate, the one or more display panel driving circuits being mounted to the second plate; and
- one or more reinforcing members disposed between the first plate and the second plate, the one or more reinforcing members connecting the first plate and the second plate, wherein a through hole is formed at a portion of the second plate of the chassis base and between a corresponding one of the one or more display panel driving circuits and the first plate.

* * * * *